(12) United States Patent
Hong et al.

(10) Patent No.: US 11,908,959 B1
(45) Date of Patent: Feb. 20, 2024

(54) LIGHT SENSOR WITH VOLTAGE REVERSING MECHANISM DETECTING LIGHT FROM AN AMBIENT LIGHT SOURCE AND A LIGHT EMITTING COMPONENT

(71) Applicant: ANPEC ELECTRONICS CORPORATION, Hsinchu (TW)

(72) Inventors: Jia-Hua Hong, Hsinchu (TW); Chih-Yuan Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 17/970,813

(22) Filed: Oct. 21, 2022

(30) Foreign Application Priority Data

Jul. 27, 2022 (TW) .................................. 111128077

(51) Int. Cl.
*H01L 31/02* (2006.01)
*G01J 1/44* (2006.01)
*G01J 1/42* (2006.01)
*H05B 47/11* (2020.01)

(52) U.S. Cl.
CPC ...... *H01L 31/02016* (2013.01); *G01J 1/4204* (2013.01); *G01J 1/44* (2013.01); *H01L 31/02002* (2013.01); *H05B 47/11* (2020.01)

(58) Field of Classification Search
CPC .......... H01L 31/02016; H01L 31/02002; G01J 1/44; G01J 1/4204; H05B 47/11
See application file for complete search history.

(56) References Cited

U.S. PATENT DOCUMENTS

| | | | |
|---|---|---|---|
| 10,447,293 B1* | 10/2019 | Hairston | H03M 1/50 |
| 11,743,982 B1* | 8/2023 | Hong | G01J 1/4204 315/291 |
| 2020/0225086 A1* | 7/2020 | Greimel-Langauer | G01J 1/46 |
| 2020/0225087 A1* | 7/2020 | Raynor | H01L 27/1443 |

* cited by examiner

*Primary Examiner* — Jennifer D Bennett
(74) *Attorney, Agent, or Firm* — Li & Cai Intellectual Property (USA) Office

(57) ABSTRACT

A light sensor having a voltage reversing mechanism is provided. A photoelectric component converts a first light signal into a first photocurrent. A capacitor is charged to a first voltage by the first photocurrent. A counter counts a first coarse count value according to the first voltage. The photoelectric component converts a second light signal into a second photocurrent. The capacitor is charged from a reversed first voltage to a second voltage by the second photocurrent. The counter counts a second coarse count value according to the second voltage. The counter counts a fine count value according to the second coarse count value. One of the first light signal and the second light signal is emitted by both of an ambient light source and a light-emitting component and then reflected by a tested object, and the other one of them is emitted by only the ambient light source.

12 Claims, 11 Drawing Sheets

LIGHT SENSOR WITH VOLTAGE REVERSING MECHANISM DETECTING LIGHT FROM AN AMBIENT LIGHT SOURCE AND A LIGHT EMITTING COMPONENT

CROSS-REFERENCE TO RELATED PATENT APPLICATION

This application claims the benefit of priority to Taiwan Patent Application No. 111128077, filed on Jul. 27, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light sensor, and more particularly to a light sensor having a voltage reversing mechanism.

BACKGROUND OF THE DISCLOSURE

Under different environments, different brightness is required for human eyes when viewing a screen of an electronic product. Therefore, light sensors such as ambient light sensors and proximity sensors are widely applied to electronic products such as mobile devices. The brightness of the screen of the electronic product is automatically adjusted according to data sensed by the light sensor such that the human eyes can feel comfortable anywhere during use of the electronic product.

SUMMARY OF THE DISCLOSURE

In response to the above-referenced technical inadequacies, the present disclosure provides a light sensor having a voltage reversing mechanism. The light sensor includes light sensor, a voltage reversing circuit, a comparator and a counter. The photoelectric component is configured to convert light energy of a first light signal into a first photocurrent and then to provide the first photocurrent to a capacitor to charge the capacitor to a first voltage. The voltage reversing circuit is connected to the capacitor. The voltage reversing circuit is configured to reverse the first voltage to form a reverse voltage. A first input terminal of the comparator is connected to the capacitor. A second input terminal of the comparator is coupled to a reference voltage. The comparator is configured to compare the first voltage with the reference voltage to output a first comparing signal. An input terminal of the counter is connected to an output terminal of the comparator. The counter is configured to count a first coarse count value according to the first comparing signal. After the first coarse count value is counted, the photoelectric component converts light energy of a second light signal into a second photocurrent and provides the second photocurrent to the capacitor to charge the capacitor to a second voltage from the reverse voltage. The comparator compares the second voltage with the reference voltage to output a second comparing signal. The counter counts a second coarse count value according to the second comparing signal. After the second coarse count value is counted, the counter performs a fine counting operation on the second coarse count value to count a fine count value. One of the first light signal and the second light signal is a light signal that is emitted by both of a light-emitting component and an ambient light source, and then is reflected by a tested object. The other one of the first light signal and the second light signal is a light signal that is emitted by only the ambient light source.

In certain embodiments, the voltage reversing circuit reverses the first voltage that is a positive voltage to form the reverse voltage that is a negative voltage. An absolute value of the reverse voltage is equal to the first voltage.

In certain embodiments, the capacitor is charged to the second voltage that is a positive value from the reverse voltage that is a negative voltage, by the second photocurrent.

In certain embodiments, when the light energy of the light signal emitted by only the ambient light source is larger than an energy threshold, the counter counts the first coarse count value according to the light signal that is emitted by both of the light-emitting component and the ambient light source and then is reflected by the tested object, within a first phase time. After the first phase time ends, the counter counts the second coarse count value according to the light signal emitted by only the ambient light source, within a second phase time.

In certain embodiments, when the light energy of the light signal emitted by only the ambient light source is smaller than an energy threshold, the counter counts the first coarse count value according to the light signal emitted by only the ambient light source, within a first phase time. After the first phase time ends, the counter counts the second coarse count value according to the light signal that is emitted by both of the light-emitting component and the ambient light source and then is reflected by the tested object, within a second phase time.

In certain embodiments, the light sensor further includes a current supplying component. The current supplying component is connected to the capacitor. The current supplying component is configured to supply a bias current to the capacitor to charge the capacitor when the photoelectric component provides the second photocurrent to the capacitor.

In certain embodiments, the current supplying component provides the bias current to the capacitor to charge the capacitor when the photoelectric component provides the first photocurrent to the capacitor.

In certain embodiments, when the light energy of the light signal emitted by only the ambient light source is smaller than an energy threshold, the current supplying component provides the bias current to the capacitor to charge the capacitor.

In certain embodiments, the current supplying component includes a current source.

In certain embodiments, the light sensor further includes a current amplifier. The current amplifier is connected to the photoelectric component and the capacitor. The current amplifier is configured to amplify the second photocurrent and then to provide the second photocurrent amplified to the capacitor to charge the capacitor.

In certain embodiments, the current amplifier is configured to amplify the first photocurrent and then to provide the first photocurrent amplified to the capacitor to charge the capacitor.

In certain embodiments, the voltage reversing circuit includes a first switch component. A first terminal of the first switch component is connected to the photoelectric component and the first input terminal of the comparator. A second terminal of the first switch component is connected to a first terminal of the capacitor. A first terminal of the second switch component is connected to a second terminal of the capacitor. A second terminal of the second switch component is grounded. A first terminal of the third switch component is connected to the photoelectric component and the first input terminal of the comparator. A second terminal of the third switch component is connected to the second terminal of the capacitor. A first terminal of the fourth switch component is connected to the first terminal of the capacitor. A second terminal of the fourth switch component is grounded. When the first switch component and the second switch component are turned on, the capacitor is charged to the first voltage. When the third switch component and the fourth switch component are turned on, the capacitor is charged to the second voltage from the reverse voltage of the first voltage.

As described above, the present disclosure provides the light sensor having the voltage reversing mechanism, which has the following advantages.

The light sensor of the present disclosure mainly includes the voltage reversing circuit. When the capacitor is charged to the first voltage, the voltage reversing circuit reverses the first voltage to form the reverse voltage that is the negative voltage from which a residual voltage is removed. The capacitor is charged from the reverse voltage to the second voltage, and then the fine counting operation is performed on the second voltage of the capacitor. It is worth noting that, the light sensor of the present disclosure only performs the fine counting operation on the voltage of the capacitor once due to the residual voltage is removed from the reverse voltage.

The light sensor of the present disclosure performs the fine counting operation only within a single non-window time in each of a plurality of sensing cycles. Therefore, the light sensor of the present disclosure can be flexibly used in more optical applications.

The light sensor of the present disclosure continuously senses the light signals within the single window time replacing the two non-consecutive times of a conventional light sensor. Therefore, the light signals sensed by the light sensor of the present disclosure only slightly change over time. As a result, the count values that are counted according to the sensed light signals by the light sensor of the present disclosure are accurate values.

The light sensor of the present disclosure senses all of the light signals within the single window time that may be a short window time. Therefore, the light sensor of the present disclosure can be placed under a screen of the electronic device.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
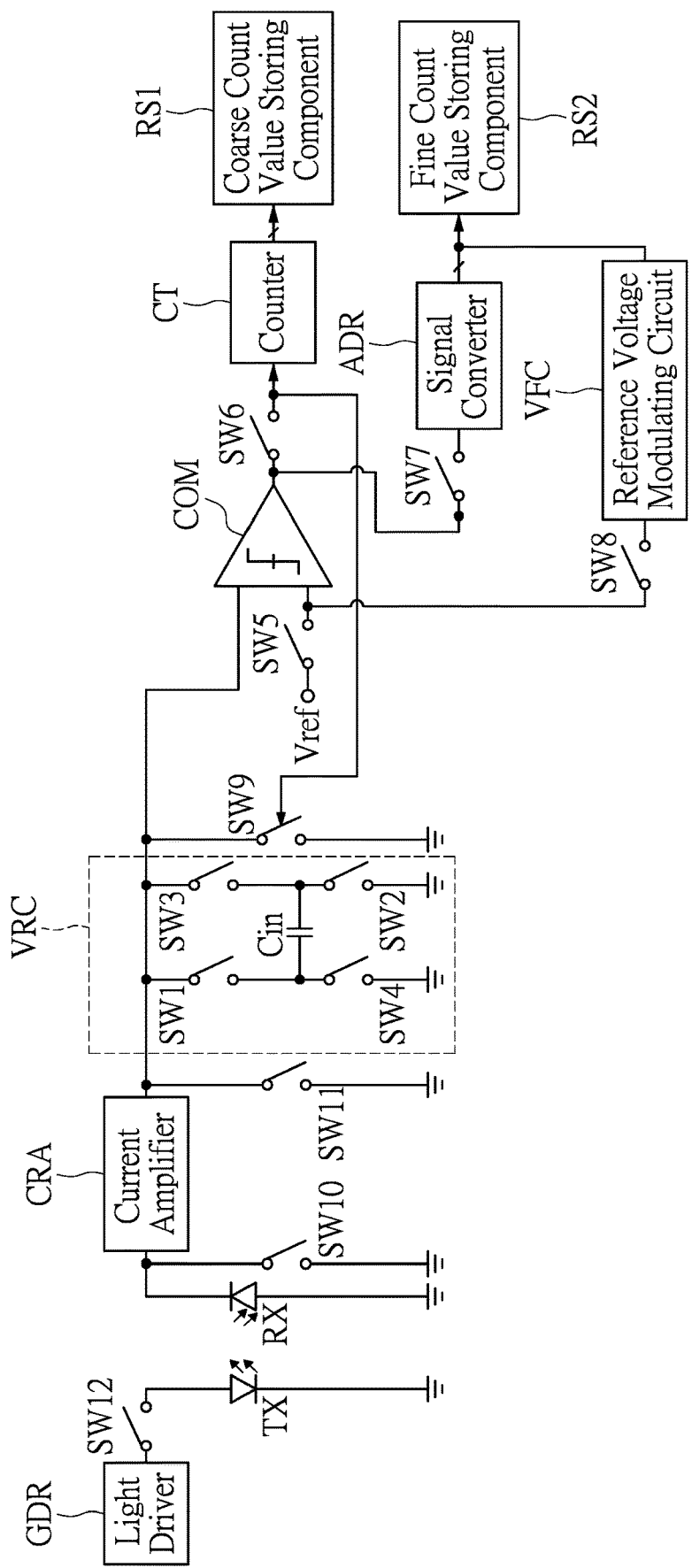
FIG. 1 is a circuit diagram of a light sensor having a voltage reversing mechanism according to first and second embodiments of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
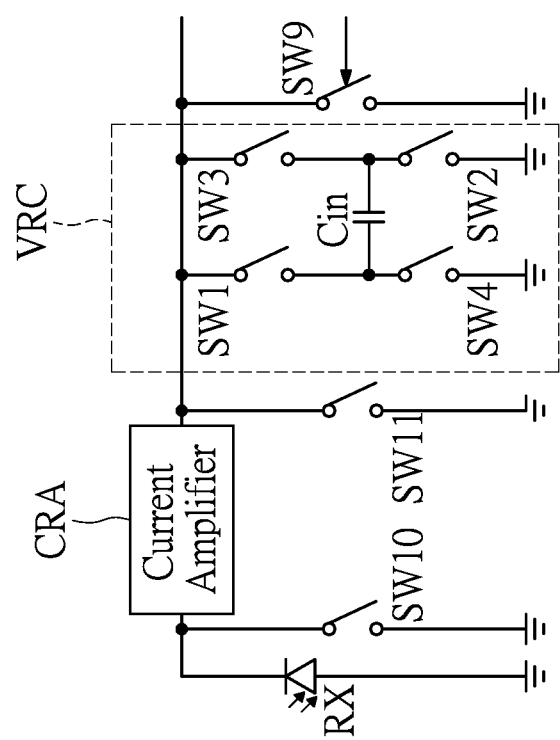
FIG. 2 is a circuit diagram of a voltage reversing circuit, a photoelectric component and a current amplifier of the light sensor having the voltage reversing mechanism according to the first and second embodiments of the present disclosure.

Reference is made to FIGS. 1 and 2, in which FIG. 1 is a circuit diagram of a light sensor having a voltage reversing mechanism according to first and second embodiments of the present disclosure, and FIG. 2 is a circuit diagram of a voltage reversing circuit, a photoelectric component and a current amplifier of the light sensor having the voltage reversing mechanism according to the first and second embodiments of the present disclosure.

As shown in FIG. 1, the light sensor of the first and second embodiments of the present disclosure may include a photoelectric component RX, a current amplifier CRA, a tenth switch component SW10, an eleventh switch component SW11, a capacitor Cin, a fifth switch component SW5, a comparator COM, a sixth switch component SW6, a counter CT, a coarse count value storing component RS1, a seventh switch component SW7, a signal convertor ADR, a reference voltage modulating circuit VFC, an eighth switch component SW8, a ninth switch component SW9, and a fine count value storing component RS2.

For the convenience of description, the light sensor of the first and second embodiments of the present disclosure includes all of the circuit components shown in FIG. 1 as described in the following, but the present disclosure is not limited thereto. In practice, the light sensor of the present disclosure may only include some of the circuit components shown in FIG. 1, and others of the circuit components may be omitted.

It is worth noting that, the light sensor of the present disclosure further includes a voltage reversing circuit VRC as shown in FIGS. 1 and 2. For example, as shown in FIGS. 1 and 2, the voltage reversing circuit VRC may include a first switch component SW1, a second switch component SW2, a third switch component SW3 and a fourth switch component SW4, but the present disclosure is not limited thereto.

A first terminal of the first switch component SW1 of the voltage reversing circuit VRC may be connected to a cathode of the photoelectric component RX (through the current amplifier CRA), and may be connected to a first input terminal of the comparator COM. An anode of the photoelectric component RX may be grounded. A second terminal of the first switch component SW1 may be connected to a first terminal of the capacitor Cin. A first terminal of the second switch component SW2 of the voltage reversing circuit VRC may be connected to a second terminal of the capacitor Cin. A second terminal of the second switch component SW2 may be grounded.

A first terminal of the third switch component SW3 of the voltage reversing circuit VRC may be connected to the cathode of the photoelectric component RX (through the current amplifier CRA), and may be connected to the first input terminal of the comparator COM. A second terminal of the third switch component SW3 may be connected to the second terminal of the capacitor Cin. A first terminal of the fourth switch component SW4 of the voltage reversing circuit VRC may be connected to the first terminal of the capacitor Cin. A second terminal of the fourth switch component SW4 may be grounded.

A second input terminal of the comparator COM may be connected to a first terminal of the fifth switch component SW5. A second terminal of the fifth switch component SW5 may be coupled to a reference voltage Vref. An output terminal of the comparator COM may be connected to a first terminal of the sixth switch component SW6. A second terminal of the sixth switch component SW6 may be connected to an input terminal of the counter CT. An output terminal of the counter CT may be connected to an input terminal of the coarse count value storing component RS1.

The output terminal of the comparator COM may be connected to a first terminal of the seventh switch component SW7. A second terminal of the seventh switch component SW7 may be connected to an input terminal of the signal convertor ADR. An output terminal of the signal convertor ADR may be connected to an input terminal of the reference voltage modulating circuit VFC and an input terminal of the fine count value storing component RS2.

An output terminal of the reference voltage modulating circuit VFC may be connected to a first terminal of the eighth switch component SW8. A second terminal of the eighth switch component SW8 may be connected to the second input terminal of the comparator COM.

It should be understood that, a control terminal of each of the first to twelfth switch components SW1 to SW12 except for the ninth switch component SW9 may be connected to an external control circuit, and the first to twelfth switch components SW1 to SW12 except for the ninth switch component SW9 may be turned on or off by the external control circuit.

A control terminal of the ninth switch component SW9 may be connected to the second terminal of the sixth switch component SW6. A first terminal of the ninth switch component SW9 may be connected to the first input terminal of the comparator COM. A second terminal of the ninth switch component SW9 may be grounded.

A first terminal of the tenth switch component SW10 may be connected to an input terminal of the current amplifier CRA. A second terminal of the tenth switch component SW10 may be grounded. A first terminal of the eleventh switch component SW11 may be connected to an output terminal of the current amplifier CRA. A second terminal of the eleventh switch component SW11 may be grounded.

A first terminal of the twelfth switch component SW12 may be connected to an output terminal of a light driver GDR. A second terminal of the twelfth switch component SW12 may be connected to an anode of a light-emitting component TX such as a light-emitting diode. A cathode of the light-emitting component TX may be grounded.

Figure 3:
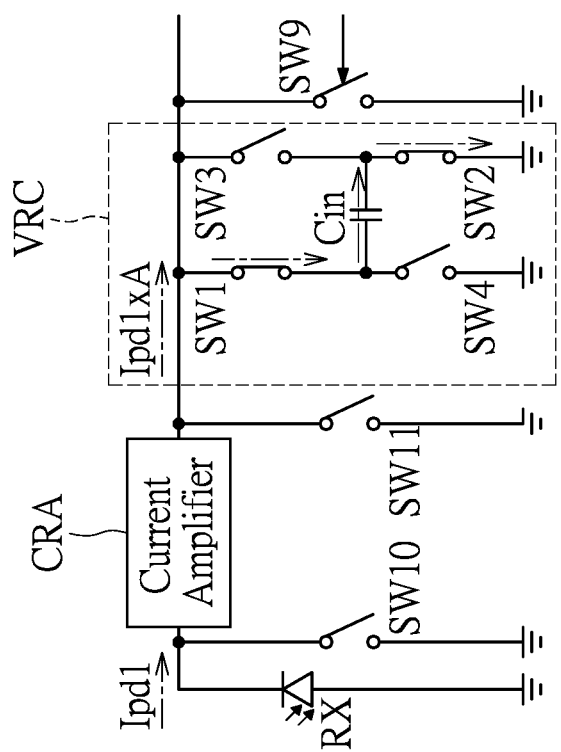
FIG. 3 is a schematic diagram of flowing of a photocurrent provided to a capacitor within a first phase time by the light sensor having the voltage reversing mechanism according to the first and second embodiments of the pre sent disclosure.
Figure 4:
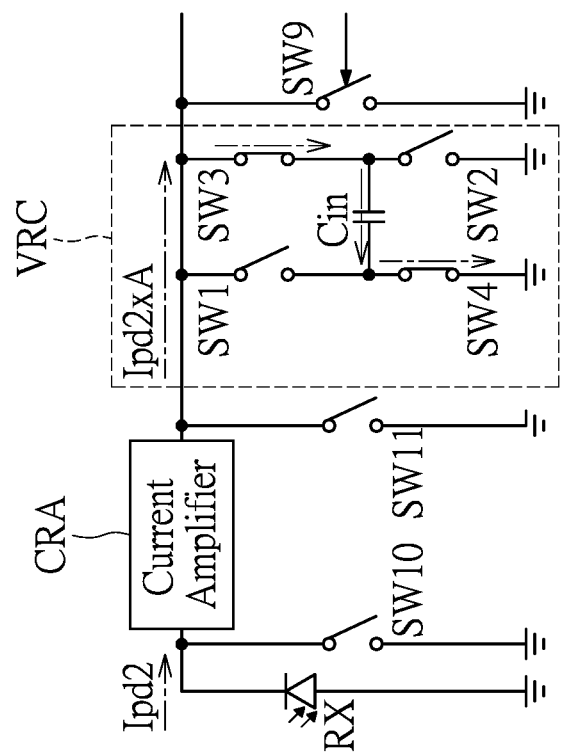
FIG. 4 is a schematic diagram of flowing of a photocurrent provided to the capacitor within a second phase time by the light sensor having the voltage reversing mechanism according to the first and second embodiments of the pre sent disclosure.

Reference is made to FIGS. 1 to 4, in which FIG. 3 is a schematic diagram of flowing of a photocurrent provided to a capacitor within a first phase time by the light sensor having the voltage reversing mechanism according to the first and second embodiments of the present disclosure, and FIG. 4 is a schematic diagram of flowing of a photocurrent provided to the capacitor within a second phase time by the light sensor having the voltage reversing mechanism according to the first and second embodiments of the pre sent disclosure.

First, as shown in FIG. 3, the first switch component SW1 and the second switch component SW2 are turned on, and the third switch component SW3 and the fourth switch component SW4 are turned off, at the same time. At this time, the cathode of the photoelectric component RX is connected to the first terminal of the capacitor Cin through (the current amplifier CRA and) the first switch component SW1 being turned on. The second terminal of the capacitor Cin is grounded through the second switch component SW2 being turned on.

As shown in FIG. 3, the photoelectric component RX receives a first light signal and converts light energy of the first light signal into a first photocurrent Ipd1. The first photocurrent Ipd1 (is multiplied by a gain A by using the current amplifier CRA and then) flows sequentially through the first switch component SW1 being turned on, the capacitor Cin and the second switch component SW2 being turned on to a ground. As a result, the capacitor Cin is charged to a first voltage by the first photocurrent Ipd1.

After the capacitor Cin is charged to the first voltage by the first photocurrent Ipd1, as shown in FIG. 4, the first switch component SW1 and the second switch component SW2 are turned off, and the third switch component SW3 and the fourth switch component SW4 are turned on, at the same time. At this time, the cathode of the photoelectric component RX is connected to the second terminal of the capacitor Cin through (the current amplifier CRA and) the third switch component SW3 being turned on, and the first terminal of the capacitor Cin is grounded through the fourth switch component SW4 being turned on.

As shown in FIG. 4, the photoelectric component RX receives a second light signal and converts light energy of the second light signal into a second photocurrent Ipd2. The second photocurrent Ipd2 (is multiplied by the gain A by using the current amplifier CRA and then) flows sequentially through the third switch component SW3 being turned on, the capacitor Cin and the fourth switch component SW4 being turned on to the ground. As a result, the capacitor Cin is charged to a second voltage by the second photocurrent Ipd2.

It is worth noting that, the first photocurrent Ipd1 flows from the first terminal of the capacitor Cin to the second terminal of the capacitor Cin, but the second photocurrent Ipd2 flows from the second terminal of the capacitor Cin to the first terminal of the capacitor Cin. Therefore, after the capacitor Cin is charged from a zero value to the first voltage by the first photocurrent Ipd1, the capacitor Cin is charged from the reversed first voltage to the second voltage. The reversed first voltage is the reverse voltage described herein. An absolute value of the reverse voltage is equal to the first voltage.

Figure 5:
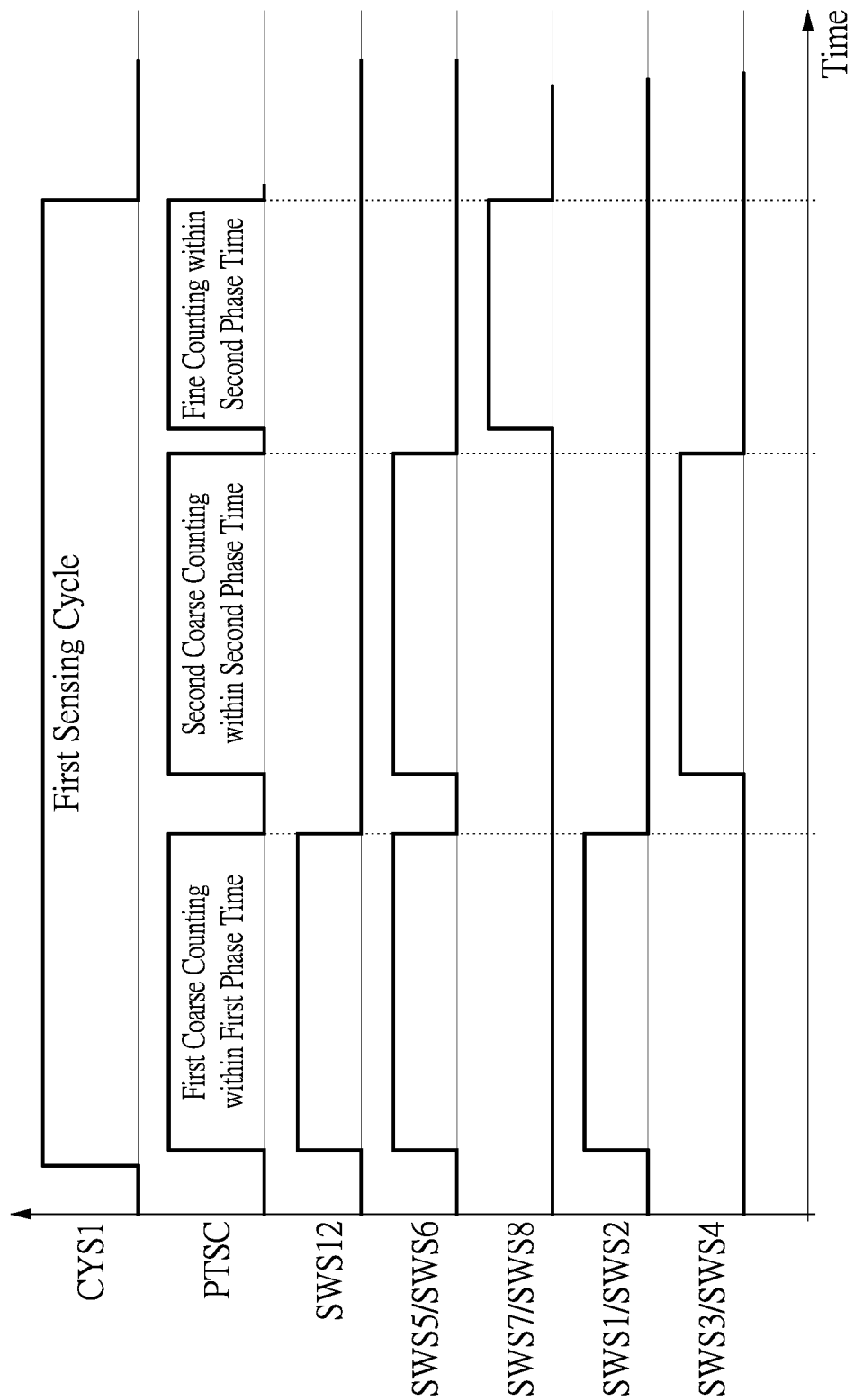
FIG. 5 is a waveform diagram of signals of switch components of the light sensor having the voltage reversing mechanism according to the first embodiment of the present disclosure.
Figure 6:
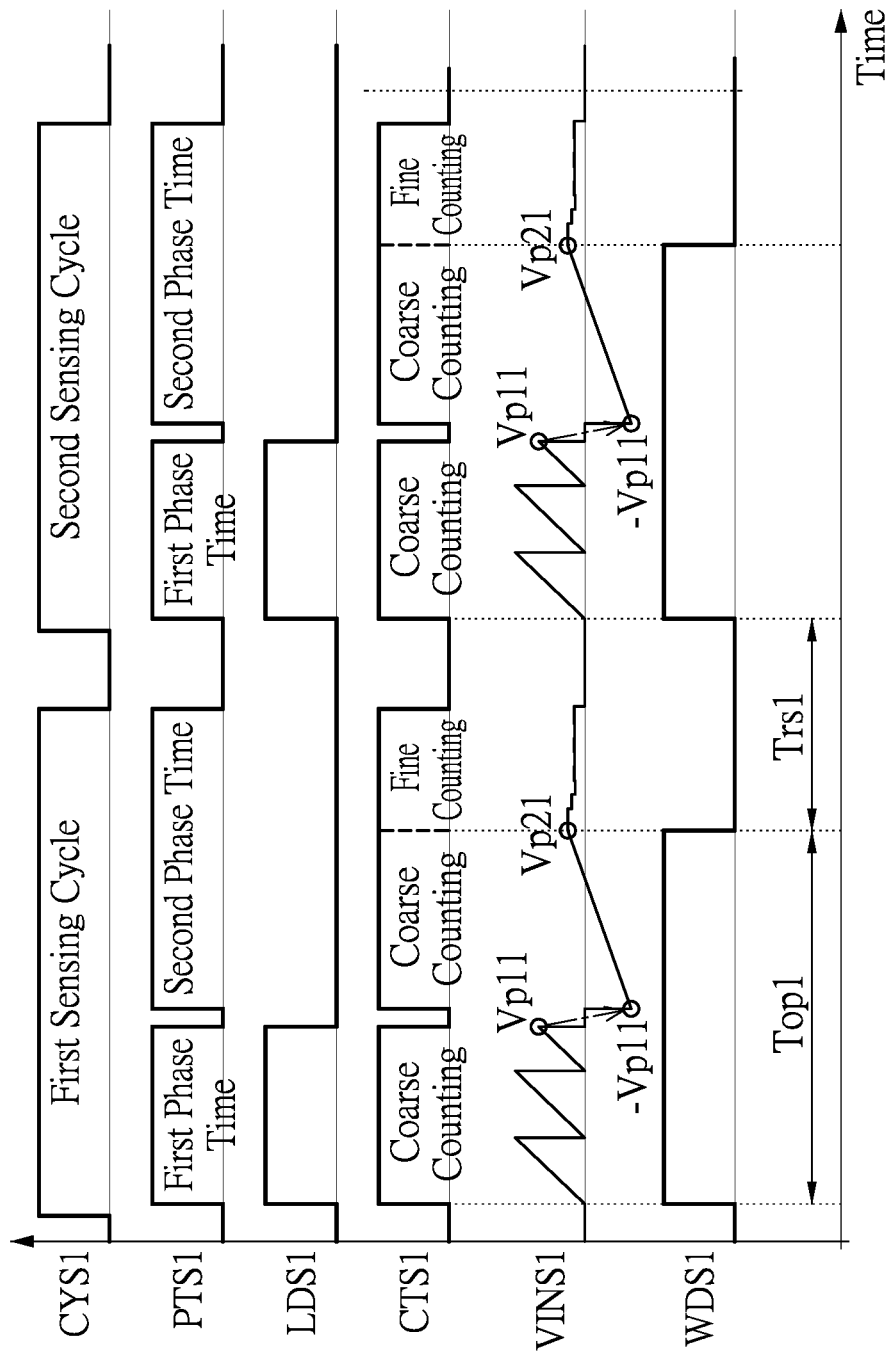
FIG. 6 is a waveform diagram of signals of sensing and counting operations performed by the light sensor having the voltage reversing mechanism according to the first embodiment of the present disclosure.

Reference is made to FIGS. 1 to 6, in which FIG. 5 is a waveform diagram of signals of switch components of the light sensor having the voltage reversing mechanism according to the first embodiment of the present disclosure, and FIG. 6 is a waveform diagram of signals of sensing and counting operations performed by the light sensor having the voltage reversing mechanism according to the first embodiment of the present disclosure.

The light sensor of the present disclosure may perform a plurality of sensing cycles such as but not limited to a first sensing cycle and a second sensing cycle of a sensing cycle signal CYS1 as shown in FIGS. 5 and 6. It is worth noting that, in each of the plurality of sensing cycles, the light sensor of the present disclosure performs a coarse counting operation twice, but only performs a fine counting operation once, as described in detail in the following.

First, as shown in FIG. 5, within the first phase time of a phase time counting signal PTSC, a twelfth switch conduction signal SWS12 is at a high level, which represents that the twelfth switch component SW12 as shown in FIG. 1 is turned on. At this time, the light driver GDR shown in FIG. 1 outputs a light driving signal to the light-emitting component TX through the twelfth switch component SW12 being turned on. As a result, both of the light-emitting component TX and an ambient light source emit a light signal.

As shown in FIG. 6, within the first phase time of a phase time signal PTS1, a light-emitting component signal LDS1 is at a high level, which represents that the light-emitting component TX is turned on.

The light signal that is emitted by both of the light-emitting component TX and the light signal is reflected by a tested object (such as a human body) to form a first light signal. The photoelectric component RX receives the first light signal, and may convert the first light signal into the first photocurrent Ipd1 as shown in FIG. 3.

As shown in FIG. 5, within the first phase time of the phase time counting signal PTSC, a first switch conduction signal SWS1 and a second conduction signal SWS2 are at a high level, which respectively represent that the first switch component SW1 and the second switch component SW2 as shown in FIG. 1 are turned on.

As shown in FIG. 3, the first photocurrent Ipd1 that is outputted by the photoelectric component RX (and then is multiplied by the gain A by using the current amplifier CRA) flows sequentially through the first switch component SW1 being turned on, the first terminal of the capacitor Cin, the second terminal of the capacitor Cin and the second switch component SW2 being turned on to the ground. As a result, the capacitor Cin is charged to a first voltage Vp11 of a capacitor voltage signal VINS1 as shown in FIG. 6, by the first photocurrent Ipd1. The first voltage Vp11 of the capacitor Cin is a positive voltage. The first voltage Vp11 of the capacitor Cin is inputted to the first input terminal of the comparator COM.

As shown in FIG. 5, within the first phase time of the phase time counting signal PTSC, a fifth switch conduction signal SWS5 and a sixth switch conduction signal SWS6 are at a high level, which respectively represent that the fifth switch component SW5 and the sixth switch component SW6 as shown in FIG. 1 are turned on.

The reference voltage Vref is inputted to the second input terminal of the comparator COM through the fifth switch component SW5 being turned on. The comparator COM compares the first voltage Vp11 of the capacitor Cin with the reference voltage Vref to output a first comparing signal to the counter CT through the sixth switch component SW6 being turned on.

The counter CT may count a first coarse count value according to a (high) level of the first comparing signal. As a result, a first coarse counting operation of a counting operation signal CTS1 is completed, within the first phase time of the phase time counting signal PTSC as shown in FIG. 5 or the phase time signal PTS1 as shown in FIG. 6. The first coarse count value counted each time by the counter CT may be stored in the coarse count value storing component RS1 such as a register.

After the comparator COM outputs the first comparing signal (at the high level) or the counter CT counts the first coarse count value, the ninth switch component SW9 is turned on according to the first comparing signal. The first input terminal of the comparator COM is grounded through the ninth switch component SW9 being turned on. As a result, a voltage of first input terminal of the comparator COM is reset to a zero value.

The counting and resetting operations as described above are performed multiple times until when the twelfth switch component SW12 is turned off or the light-emitting component TX stops emitting the light signal. At this time, the first coarse counting operation of the first light signal that is emitted by both of the light-emitting component TX and the ambient light source and then is reflected by the tested object (such as the human body) is completed within the first phase time as shown in FIGS. 5 and 6.

After the first coarse counting operation is completed within the first phase time, a second coarse counting operation is performed within the second phase time as described in detail in the following.

As shown in FIGS. 5 and 6, within the second phase time of the phase time counting signal PTSC, the twelfth switch conduction signal SWS12 is at a low level, which represents that the twelfth switch component SW12 as shown in FIG. 1 is turned off. As a result, the light driver GDR stops driving the light-emitting component TX. As shown in FIG. 6, within the second phase time of the phase time signal PTS1, the light-emitting component signal LDS1 is at a low level, which represents that the light-emitting component TX is turned off. At this time, the photoelectric component RX only receives the light signal emitted by the ambient light source as the second light signal. The photoelectric component RX converts the second light signal into the second photocurrent Ipd2 as shown in FIG. 4.

It is worth noting that, when the second coarse counting operation is performed within the second phase time, the third switch component SW3 and the fourth switch component SW4 are turned on. As shown in FIG. 5, a third switch conduction signal SWS3 and a fourth switch conduction signal SWS4 are at a high level within the second phase time of the phase time counting signal PTSC.

As shown in FIG. 4, the second photocurrent Ipd2 that is outputted by the photoelectric component RX (and then is multiplied by the gain A by using the current amplifier CRA) flows sequentially through the third switch component SW3 being turned on, the second terminal of the capacitor CM, the first terminal of the capacitor CM and the fourth switch component SW4 being turned on to the ground. As a result, as shown in FIG. 6, the capacitor CM is charged to a second voltage Vp21 from a reverse voltage −Vp11 of the first voltage Vp11, by the second photocurrent Ipd2. The second voltage Vp21 of the capacitor CM is inputted to the first input terminal of the comparator COM.

When the coarse counting operation is performed within the second phase time, the fifth switch component SW5 and the sixth switch component SW6 as shown in FIG. 1 are turned on. As shown in FIG. 5, the fifth switch conduction signal SWS5 and the sixth switch conduction signal SWS6 are at the high level within the second phase time of the phase time counting signal PTSC.

The reference voltage Vref is inputted to the second input terminal of the comparator COM through the fifth switch component SW5 being turned on. The comparator COM compares the second voltage Vp21 of the capacitor Cin with the reference voltage Vref to output a second comparing signal to the counter CT through the sixth switch component SW6 being turned on.

The counter CT may count a second coarse count value according to a (high) level of the second comparing signal. At this time, the second coarse counting operation of the counting operation signal CTS1 is completed, within the second phase time of the phase time counting signal PTSC as shown in FIG. 5 or the phase time signal PTS1 as shown in FIG. 6. The second coarse count value counted each time by the counter CT may be stored in the coarse count value storing component RS1 such as the register.

After the comparator COM outputs the second comparing signal (at the high level) or the counter CT counts the second coarse count value, the ninth switch component SW9 is turned on according to the second comparing signal. The first input terminal of the comparator COM is grounded through the ninth switch component SW9 being turned on. As a result, the voltage of first input terminal of the comparator COM is reset to the zero value.

It is worth noting that, after the capacitor Cin is charged to the first voltage Vp11 within the first phase time, the first voltage Vp11 is reversed to form the reverse voltage −Vp11 that is the negative value from which a residual voltage is removed. Then, the capacitor Cin is charged from the reverse voltage −Vp11 to the second voltage Vp21 within the second phase time. Therefore, a fine counting operation does not need to be performed until when the coarse counting operation performed on the second voltage Vp21 is completed within the second phase time.

As shown in FIG. 6, the fine counting operation of the counting operation signal CTS1 is not performed until when the second coarse counting operation of the counting operation signal CTS1 is completed within the second phase time of the phase time signal PTS1. As shown in FIG. 5, within the second phase time of the fine counting operation, a seventh switch conduction signal SWS7 and an eighth switch conduction signal SWS8 are at a high level, which respectively represent that the seventh switch component SW7 and the eighth switch component SW8 are turned on.

The second comparing signal outputted by the comparator COM may be transmitted to the signal convertor ADR through the seventh switch component SW7 being turned on. For example, the signal convertor ADR may be a successive-approximation analog-to-digital converter (SAR), but the present disclosure is not limited thereto. The signal convertor ADR may convert the second comparing signal that is an analog signal into a converted signal that is a digital signal. The fine count value storing component RS2 may receive and store the converted signal from the signal convertor ADR, or the reference voltage modulating circuit VFC may receive the converted signal from the signal convertor ADR.

When the fine counting operation is performed within the second phase time of the phase time counting signal PTSC as shown in FIG. 5, the reference voltage modulating circuit VFC may modulate a modulated reference voltage inputted to the second input terminal of the comparator COM once or multiple times according to the converted signal (that may be the digital signal) from the signal convertor ADR. The comparator COM may compare a voltage of the first input terminal of the comparator COM with the modulated reference voltage from the reference voltage modulating circuit VFC to output a third comparing signal. The counter CT or other circuit components may count a fine count value according to the third comparing signal (or different third comparing signals). The fine count value storing component RS2 such as a register may store the fine count value.

Finally, the counter CT or other circuit components may perform an arithmetic operation on the first coarse count value counted in the first phase time, the second coarse count value counted in the second phase time and the fine count value counted in the second phase time to calculate a light sensed count value. For example, the counter CT or other circuit components may subtract the second coarse count value (or the first coarse count value) from the fine count value to obtain the light sensed count value. The light sensed count value is a count value of the light signal that is emitted by only the light-emitting component TX and then is reflected by the tested object (such as the human body).

The counter CT or other circuit components may, according to the light sensed count value, calculate a distance between the tested object (such as the human body) and an electronic device in which the light sensor of the present disclosure is disposed.

Figure 7:
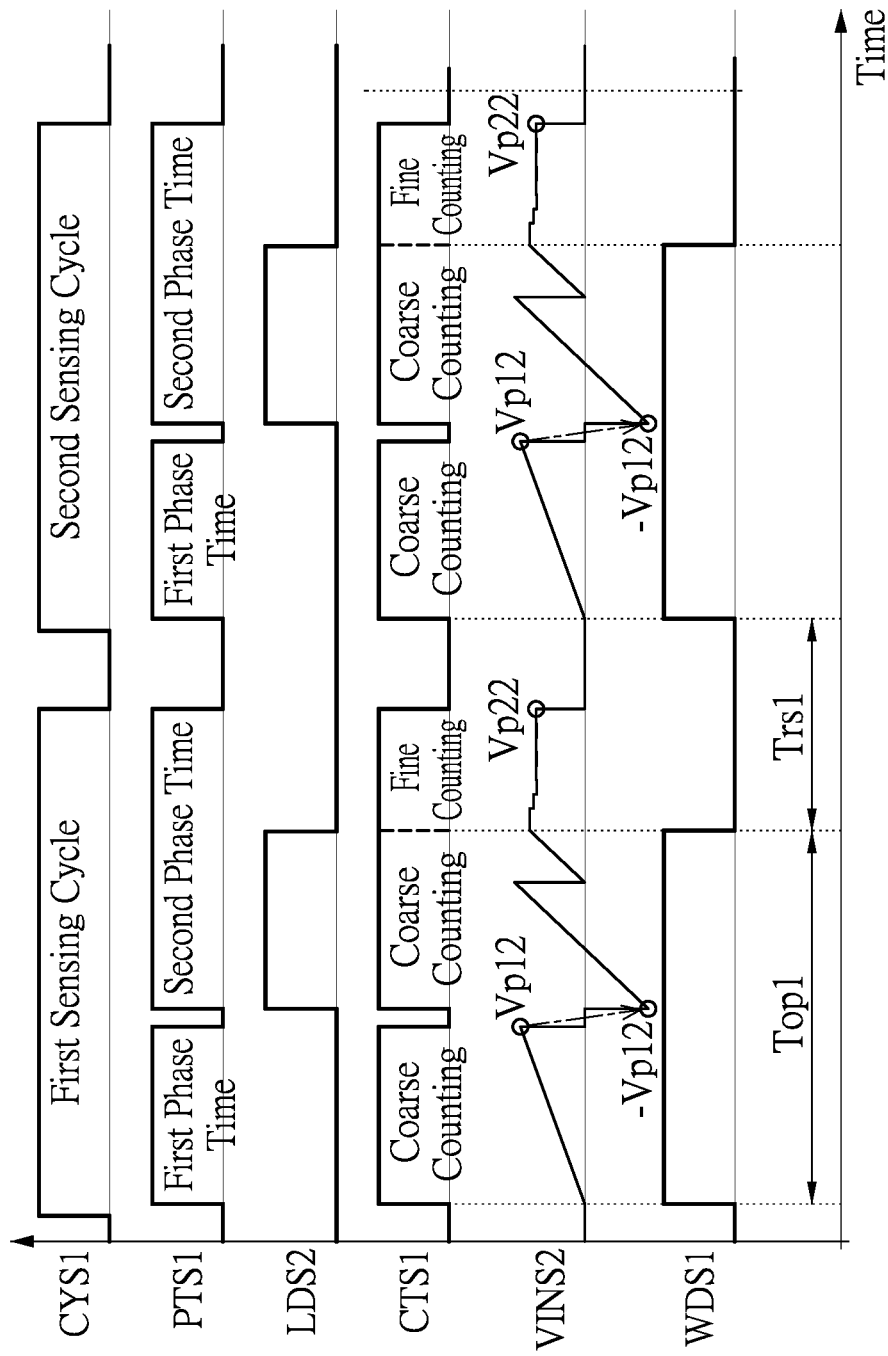
FIG. 7 is a waveform diagram of signals of sensing and counting operations performed by the light sensor having the voltage reversing mechanism according to the second embodiment of the present disclosure.

Reference is made to FIGS. 1 to 4 and FIG. 7, in which FIG. 1 is a circuit diagram of a light sensor having a voltage reversing mechanism according to first and second embodiments of the present disclosure, and FIG. 7 is a waveform diagram of signals of sensing and counting operations performed by the light sensor having the voltage reversing mechanism according to the second embodiment of the present disclosure. The same descriptions of the first and second embodiments are not repeated herein.

As shown in FIG. 6, in the first embodiment, within the first phase time, the light signal that is emitted by both of the light-emitting component TX and the ambient light source is converted into the first photocurrent Ipd1, and the capacitor Cin is charged to the first voltage Vp11 by the first photocurrent Ipd1. Then, within the second phase time, the light signal emitted by only the ambient light source is converted into the second photocurrent Ipd2, and the capacitor Cin is charged to the second voltage Vp21 from the reverse voltage −Vp11 of the first voltage Vp11, by the second photocurrent Ipd2.

In the first embodiment, if the light signal emitted by only the ambient light source is too weak, the second photocurrent Ipd2 converted from the light signal emitted by only the ambient light source is too small. As a result, after the capacitor Cin is charged from the reverse voltage −Vp11 by the second photocurrent Ipd2 within the second phase time, the voltage of the capacitor Cin is still a negative voltage. The second coarse count value is difficult to be counted according to the negative voltage.

Therefore, in the second embodiment, only the ambient light source emits the light signal within the first phase time, and then both of the light-emitting component TX and the ambient light source emits the light signal within the second phase time, as described in detail in the following.

As shown in FIG. 7, within the first phase time of the phase time signal PTS1, a light-emitting component signal LDS2 is at a low level, which represents that the light-emitting component TX is turned off or the light-emitting component TX does not emitting the light signal. As shown in FIG. 7, within the second phase time of the phase time signal PTS1, the light-emitting component signal LDS2 is at a high level, which represents that the light-emitting component TX is turned on to emit the light signal.

Within the first phase time of the phase time signal PTS1, the first photocurrent Ipd1 that is converted from the light signal emitted by only the ambient light source (and then is multiplied by the gain A by using the current amplifier CRA) flows sequentially through the first switch component SW1 being turned on, the capacitor Cin and the second switch component SW2 being turned on to the ground as shown in FIG. 3. The capacitor Cin is charged to a first voltage Vp12 from a zero value, which is represented by a capacitor voltage signal VINS2 as shown in FIG. 7.

The comparator COM may compare the first voltage Vp12 with the reference voltage Vref to output the first comparing signal. The counter CT counts the first coarse count value according to the first comparing signal.

After the first phase time of the phase time signal PTS1 ends, the first switch component SW1 and the second switch component SW2 are turned off, but the third switch component SW3 and the fourth switch component SW4 are turned on, within the second phase time of the phase time signal PTS1.

It is worth noting that, in the second embodiment, within the second phase time of the phase time signal PTS1, the photoelectric component RX converts the light signal that is emitted by both of the light-emitting component TX and the ambient light source and then is reflected to the photoelectric component RX by the tested object (such as the human body) into the second photocurrent Ipd2. Therefore, the second photocurrent Ipd2 of the second embodiment is larger than the second photocurrent Ipd2 of the first embodiment.

In the second embodiment, as shown in FIG. 4, the second photocurrent Ipd2 (that is multiplied by the gain A by using the current amplifier CRA) flows sequentially through the third switch component SW3 being turned on, the capacitor Cin and the fourth switch component SW4 being turned on to the ground. As a result, the capacitor Cin is charged from a reverse voltage −Vp12 of the first voltage Vp12 to a second voltage Vp22 that is a positive voltage, which is represented by the capacitor voltage signal VINS2 as shown in FIG. 7.

The comparator COM may compare the second voltage Vp22 with the reference voltage Vref to output the second comparing signal. The counter CT counts the second coarse count value according to the second comparing signal. After the second coarse count value is counted, the fine count value is counted as described above.

Figure 11:
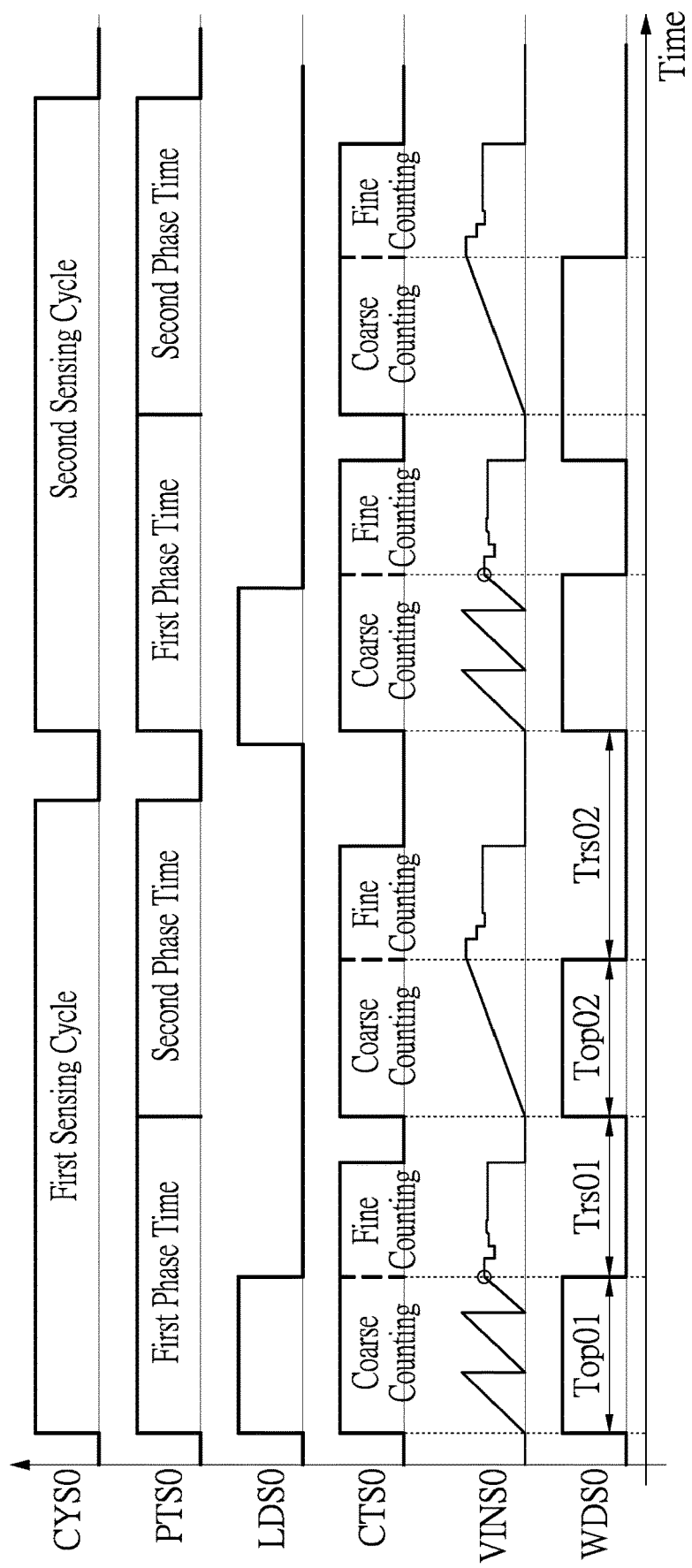
FIG. 11 is a waveform diagram of signals of a conventional light sensor.

Reference is made to FIGS. 1, 6, 7 and 11, in which FIG. 6 is a waveform diagram of signals of sensing and counting operations performed by the light sensor having the voltage reversing mechanism according to the first embodiment of the present disclosure, FIG. 7 is a waveform diagram of signals of sensing and counting operations performed by the light sensor having the voltage reversing mechanism according to the second embodiment of the present disclosure, and FIG. 11 is a waveform diagram of signals of a conventional light sensor.

Within a first window time Top01 of a window signal WDS0 in each of a plurality of sensing cycles of a sensing cycle signal CYC0 as shown in FIG. 11, a photoelectric component of the conventional light sensor is turned on to receive a light signal that is emitted by both of a light-emitting component and the ambient light source and then is reflected (by the human body). As shown in FIG. 11, within the first window time Top01 of the window signal WDS0, a light-emitting component signal LDS0 is at a high level, which represents that the light-emitting component emits the light signal. A capacitor is charged by a photocurrent converted from the light signal such that a voltage of the capacitor gradually increases within the first window time Top01, which is represented by a capacitor voltage signal VINS0 as shown in FIG. 11. The conventional light sensor performs a first coarse counting operation of a counting operation signal CTS0 on the light signal to count a first coarse count value within a first phase time of a phase time signal PSTS0.

Then, as shown in FIG. 11, the window signal WDS0 of the conventional light sensor transits from a high level to a low level. Within a first non-window time Trs01, the window signal WDS0 is maintained at the low level, which represents that the photoelectric component of the conventional light sensor is turned off and stops receiving the light signal. The conventional light sensor performs a first fine counting operation of the counting operation signal CTS0 on the first coarse count value to count a first fine count value, within the first phase time of the phase time signal PTS0.

Then, as shown in FIG. 11, the window signal WDS0 of the conventional light sensor transits from the low level to the high level. Within a second window time Top02, the window signal WDS0 is maintained at the high level, which represents that the photoelectric component of the conventional light sensor is turned on to receive the light signal emitted by only the ambient light source. The conventional light sensor performs a second coarse counting operation of the counting operation signal CTS0 on the light signal emitted by only the ambient light source to count a second coarse count value, within the second phase time of the phase time signal PTS0.

Then, as shown in FIG. 11, the window signal WDS0 of the conventional light sensor transits from the high level to the low level. Within the second non-window time Trs02, the window signal WDS0 is maintained at the low level, which represents that the photoelectric component of the conventional light sensor is turned off and stops receiving the light signal. The conventional light sensor performs a second fine counting operation of the counting operation signal CTS0 on the second coarse count value to count a second fine count value, within the second phase time of the phase time signal PTS0 shown in FIG. 11.

In contrast, as shown in FIGS. 6 and 7, in each of the plurality of sensing cycles, the photoelectric component RX of the light sensor of the present disclosure receives the light signal only within a window time Top1 of a window time signal WDS1. Then, the present disclosure performs the sensing and first coarse counting operations on the light signal that is emitted by both of the light-emitting component TX and the ambient light source and then is reflected (by the human body), and performs the sensing and second coarse counting operations on the light signal emitted by only the ambient light source.

After the light sensor of the present disclosure performs the first and second coarse counting operations within the window time Top1 of the window time signal WDS1, the photoelectric component RX of the light sensor of the present disclosure does not need to receive any light signal within a non-window time Trs1 of the window time signal WDS1 at a low level. The light sensor of the present disclosure does not need to perform the fine counting operation to count the fine count value until when all of the first and second coarse counting operations are completed.

In brief, both of the first coarse counting operation and the second coarse counting operation are performed within the window time Top1 that is a single time interval. In each of the plurality of sensing cycles, the photoelectric component RX of the light sensor of the present disclosure only needs to be turned on within the window time Top1.

In contrast, the photoelectric component of the conventional light sensor needs to be turned on within the first window time Top01 and the second window time Top02 that are two non-consecutive time. The first non-window time Trs01 exists between the first window time Top01 and the second window time Top02. The second non-window time Trs02 exists between the second window time Top02 and the next first window time Top01.

It is apparent that, a complexity of a time control mechanism applied by the light sensor of the present disclosure is lower than that of the conventional light sensor.

Furthermore, the conventional light sensor must perform the fine counting operation twice, but the light sensor of the present disclosure only needs to perform the fine counting operation once. The time required for the light sensor of the present disclosure to perform the fine counting operation can be shorten.

Figure 8:
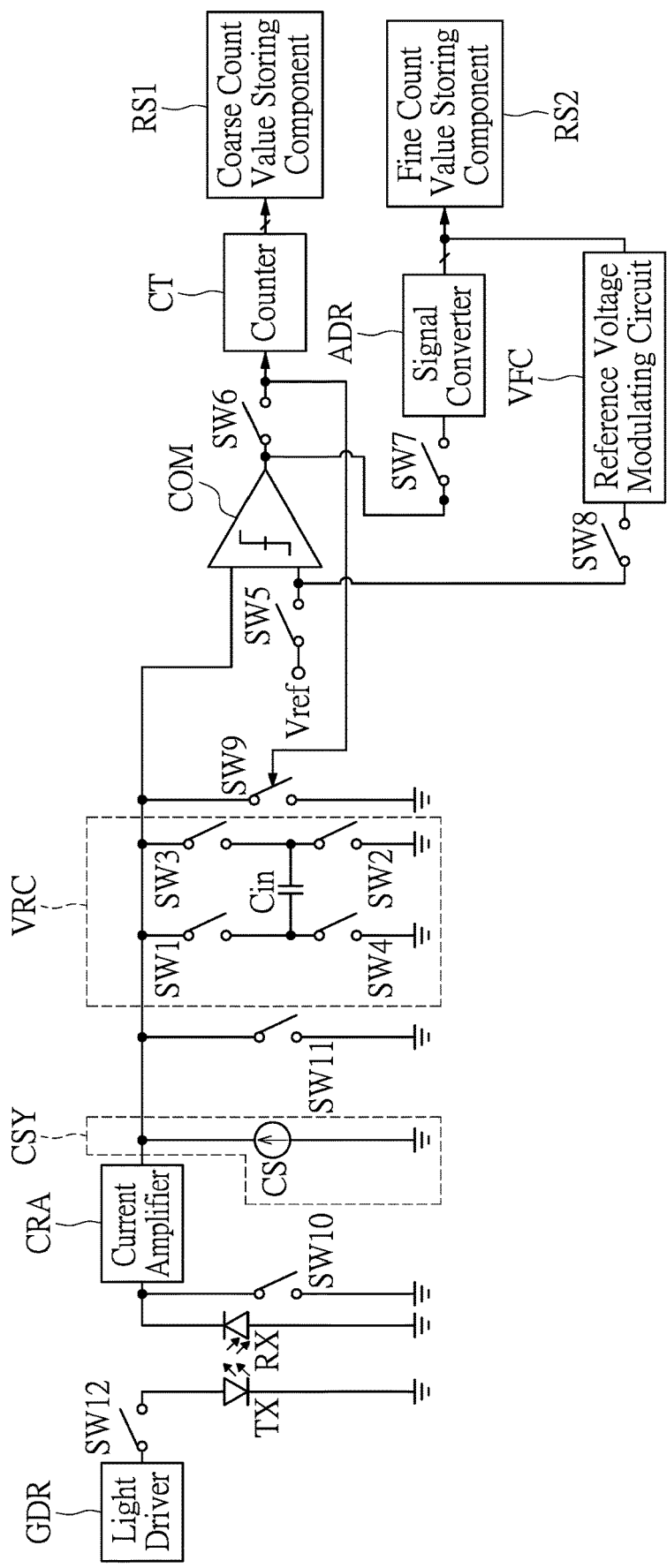
FIG. 8 is a circuit diagram of a light sensor having a voltage reversing mechanism according to a third embodiment of the present disclosure.
Figure 9:
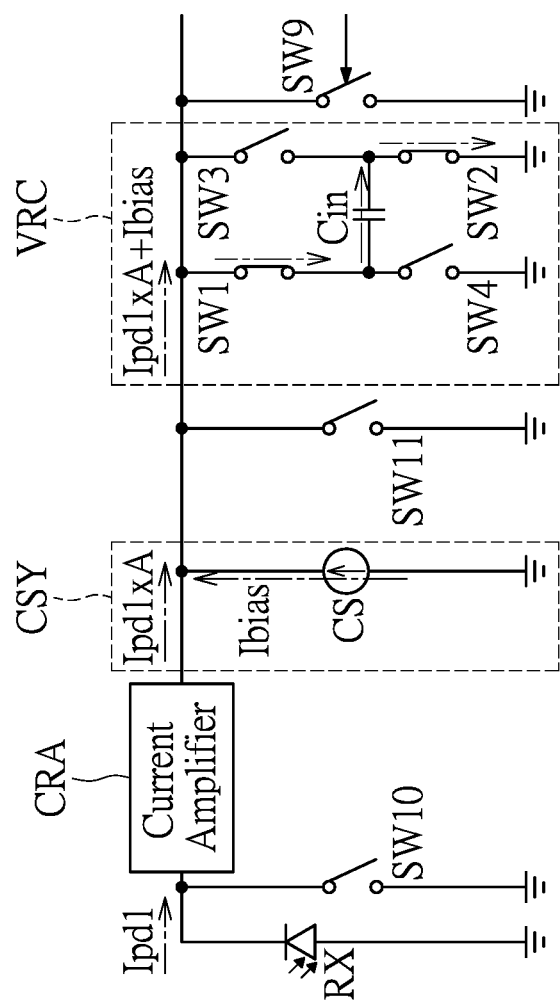
FIG. 9 is a schematic diagram of flowing of a photocurrent and a bias current that are provided to a capacitor within the first phase time by the light sensor having the voltage reversing mechanism according to the third embodiment of the present disclosure.
Figure 10:
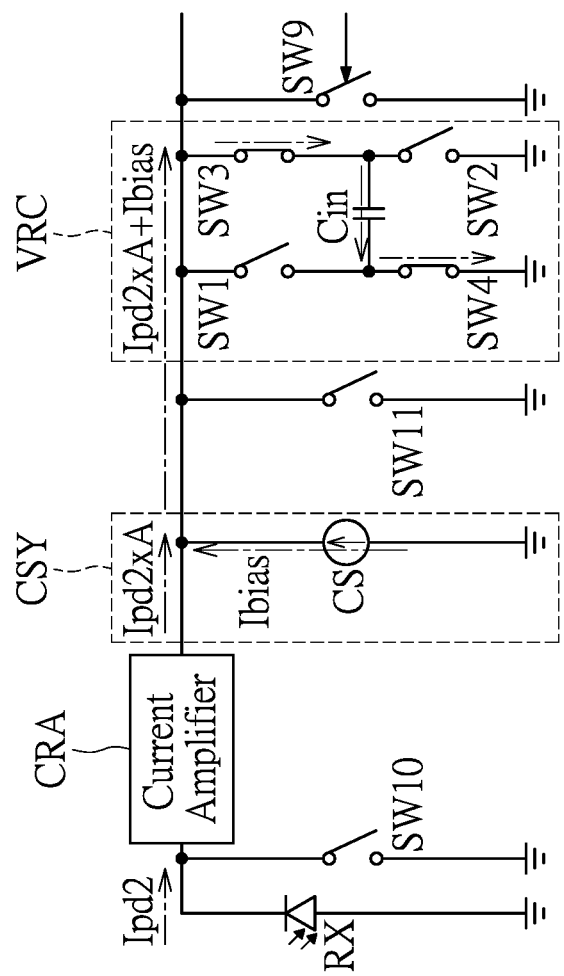
FIG. 10 is a schematic diagram of flowing of a photocurrent and the bias current that are provided to the capacitor within the second phase time by the light sensor having the voltage reversing mechanism according to the third embodiment of the present disclosure.

Reference is made to FIGS. 8 to 10, in which FIG. 8 is a circuit diagram of a light sensor having a voltage reversing mechanism according to a third embodiment of the present disclosure, FIG. 9 is a schematic diagram of flowing of a photocurrent and a bias current that are provided to a capacitor within the first phase time by the light sensor having the voltage reversing mechanism according to the third embodiment of the present disclosure, and FIG. 10 is a schematic diagram of flowing of a photocurrent and the bias current that are provided to the capacitor within the second phase time by the light sensor having the voltage reversing mechanism according to the third embodiment of the present disclosure. The same descriptions of the first and third embodiments are not repeated herein.

As shown in FIG. 6, in the first embodiment, within the first phase time, the light signal that is emitted by both of the light-emitting component TX and the ambient light source is converted into the first photocurrent Ipd1, and the capacitor Cin is charged to the first voltage Vp11 by the first photocurrent Ipd1. Then, within the second phase time, the light signal emitted by only the ambient light source is converted into the second photocurrent Ipd2, and the capacitor Cin is charged from the reverse voltage −Vp11 of the first voltage Vp11 to the second voltage Vp21 by the second photocurrent Ipd2.

In the first embodiment, if the light signal emitted by only the ambient light source is too weak, the second photocurrent Ipd2 converted from the light signal emitted by only the ambient light source is too small. As a result, after the capacitor Cin is charged from the reverse voltage −Vp11 by the second photocurrent Ipd2 within the second phase time, the voltage of the capacitor Cin is still the negative voltage. The second coarse count value is difficult to be counted according to the negative voltage.

Therefore, a difference between the first and third embodiments is that, the light sensor of the third embodiment further includes a current supplying component CSY. For example, the current supplying component CSY may include a current source CS as shown in FIG. 8, but the present disclosure is not limited thereto. In practice, the current supplying component CSY may include other current supplying components.

As shown in FIGS. 8 and 9, within the first phase time, the first light signal that is emitted by both of the light-emitting component TX and the ambient light source, and then is reflected to the photoelectric component RX by the tested object (such as the human body). The photoelectric component RX converts the first light signal into the first photocurrent Ipd1. The first photocurrent Ipd1 (is multiplied by the gain A by using the current amplifier CRA and then) flows together with a bias current Ibias provided by the current supplying component CSY sequentially through the first switch component SW1 being turned on, the capacitor Cin and the second switch component SW2 being turned on to the ground.

The comparator COM compares the reference voltage Vref with the voltage of the capacitor Cin being charged by both of the first photocurrent Ipd1 and the bias current Ibias to output the first comparing signal, within the first phase time. The counter CT counts the first coarse count value according to the (high) level of the first comparing signal from the comparator COM, within the first phase time.

As shown in FIGS. 8 and 10, within the second phase time, only the ambient light source but not the light-emitting component TX emits the light signal. The photoelectric component RX converts the light signal emitted by only the ambient light source into the second photocurrent Ipd2. The second photocurrent Ipd2 (is multiplied by the gain A by using the current amplifier CRA and then) flows together with the bias current Ibias provided by the current supplying component CSY sequentially through the third switch component SW3 being turned on, the capacitor Cin and the fourth switch component SW4 being turned on to the ground.

It is worth noting that, within the second phase time, the capacitor Cin is charged from the reverse voltage to be higher than a voltage threshold such as a zero value, by both of the second photocurrent Ipd2 and the bias current Ibias. As a result, the counting operations performed on the voltage of the capacitor Cin is easily to be completed as described in the following.

The comparator COM compares the reference voltage Vref with the voltage of the capacitor Cin being charged by both of the second photocurrent Ipd2 and the bias current Ibias to output the second comparing signal, within the second phase time. The counter CT may count the second coarse count value according to the (high) level of the second comparing signal from the comparator COM, within the second phase time.

The counter CT performs the fine counting operation on the second coarse counting operation to count the fine count value. Finally, the counter CT performs the arithmetic operation on the first coarse count value, the second coarse count value and the fine count value to calculate the light sensed count value.

For example, the counter CT may subtract the first coarse count value from the fine count value to obtain a value as the light sensed count value. Alternatively, the counter CT may subtract the second coarse count value from the fine count value to obtain a value as the light sensed count value. Alternatively, the counter CT may calculate an average value of the first sensed count value and the second sensed count value as the light sensed count value. Although the bias current Ibias is provided within the first phase time and the second phase time, the light sensed count value is not be affected by the bias current Ibias because the above-mentioned subtracting operation is performed on both of the fine and coarse count values.

Beneficial Effects of the Embodiments

In conclusion, the present disclosure provides the light sensor having the voltage reversing mechanism, which has the following advantages.

The light sensor of the present disclosure mainly includes the voltage reversing circuit. When the capacitor is charged to the first voltage, the voltage reversing circuit reverses the first voltage to form the reverse voltage that is the negative voltage from which the residual voltage is removed. The capacitor is charged from the reverse voltage to the second voltage, and then the fine counting operation is performed on the second voltage of the capacitor. It is worth noting that, the light sensor of the present disclosure only performs the fine counting operation on the voltage of the capacitor once due to the residual voltage is removed from the reverse voltage.

The light sensor of the present disclosure performs the fine counting operation only within the single non-window time in each of the plurality of sensing cycles. Therefore, the light sensor of the present disclosure can be flexibly used in more optical applications.

The light sensor of the present disclosure continuously senses the light signals within the single window time replacing the two non-consecutive times of the conventional light sensor. Therefore, the light signals sensed by the light sensor of the present disclosure only slightly change over time. As a result, the count values that are counted according to the sensed light signals by the light sensor of the present disclosure are accurate values.

The light sensor of the present disclosure senses all of the light signals within the single window time that may be a short window time. Therefore, the light sensor of the present disclosure can be placed under a screen of the electronic device.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light sensor having a voltage reversing mechanism, comprising:
   a photoelectric component configured to convert light energy of a first light signal into a first photocurrent and then to provide the first photocurrent to a capacitor to charge the capacitor to a first voltage;
   a voltage reversing circuit connected to the capacitor and configured to reverse the first voltage to form a reverse voltage;
   a comparator, wherein a first input terminal of the comparator is connected to the capacitor, a second input terminal of the comparator is coupled to a reference voltage, and the comparator is configured to compare the first voltage with the reference voltage to output a first comparing signal; and
   a counter, wherein an input terminal of the counter is connected to an output terminal of the comparator, and the counter is configured to count a first coarse count value according to the first comparing signal;
   wherein, after the first coarse count value is counted, the photoelectric component converts light energy of a second light signal into a second photocurrent and provides the second photocurrent to the capacitor to charge the capacitor to a second voltage from the reverse voltage;
   wherein, the comparator compares the second voltage with the reference voltage to output a second comparing signal, and the counter counts a second coarse count value according to the second comparing signal;
   wherein, after the second coarse count value is counted, the counter performs a fine counting operation on the second coarse count value to count a fine count value;
   wherein, one of the first light signal and the second light signal is a light signal that is emitted by both of a light-emitting component and an ambient light source and then is reflected by a tested object, and the other one of the first light signal and the second light signal is a light signal that is emitted by only the ambient light source.

2. The light sensor according to claim 1, wherein the voltage reversing circuit reverses the first voltage that is a positive voltage to form the reverse voltage that is a negative voltage, and an absolute value of the reverse voltage is equal to the first voltage.

3. The light sensor according to claim 1, wherein the capacitor is charged to the second voltage that is a positive value from the reverse voltage that is a negative voltage, by the second photocurrent.

4. The light sensor according to claim 1, wherein, when the light energy of the light signal emitted by only the ambient light source is larger than an energy threshold, the counter counts the first coarse count value according to the light signal that is emitted by both of the light-emitting component and the ambient light source and then is reflected by the tested object, within a first phase time;
wherein, after the first phase time ends, the counter counts the second coarse count value according to the light signal emitted by only the ambient light source, within a second phase time.

5. The light sensor according to claim 1, wherein, when the light energy of the light signal emitted by only the ambient light source is smaller than an energy threshold, the counter counts the first coarse count value according to the light signal emitted by only the ambient light source, within a first phase time;
wherein, after the first phase time ends, the counter counts the second coarse count value according to the light signal that is emitted by both of the light-emitting component and the ambient light source and then is reflected by the tested object, within a second phase time.

6. The light sensor according to claim 1, further comprising:
a current supplying component connected to the capacitor, and configured to supply a bias current to the capacitor to charge the capacitor when the photoelectric component provides the second photocurrent to the capacitor.

7. The light sensor according to claim 6, wherein the current supplying component provides the bias current to the capacitor to charge the capacitor when the photoelectric component provides the first photocurrent to the capacitor.

8. The light sensor according to claim 6, wherein, when the light energy of the light signal emitted by only the ambient light source is smaller than an energy threshold, the current supplying component provides the bias current to the capacitor to charge the capacitor.

9. The light sensor according to claim 6, wherein the current supplying component includes a current source.

10. The light sensor according to claim 1, further comprising:
a current amplifier connected to the photoelectric component and the capacitor, and configured to amplify the second photocurrent and then to provide the second photocurrent amplified to the capacitor to charge the capacitor.

11. The light sensor according to claim 10, wherein the current amplifier is configured to amplify the first photocurrent and then to provide the first photocurrent amplified to the capacitor to charge the capacitor.

12. The light sensor according to claim 1, wherein the voltage reversing circuit includes:
a first switch component, wherein a first terminal of the first switch component is connected to the photoelectric component and the first input terminal of the comparator, and a second terminal of the first switch component is connected to a first terminal of the capacitor;
a second switch component, wherein a first terminal of the second switch component is connected to a second terminal of the capacitor, and a second terminal of the second switch component is grounded;
a third switch component, wherein a first terminal of the third switch component is connected to the photoelectric component and the first input terminal of the comparator, and a second terminal of the third switch component is connected to the second terminal of the capacitor; and
a fourth switch component, wherein a first terminal of the fourth switch component is connected to the first terminal of the capacitor, and a second terminal of the fourth switch component is grounded;
wherein, when the first switch component and the second switch component are turned on, the capacitor is charged to the first voltage;
wherein, when the third switch component and the fourth switch component are turned on, the capacitor is charged to the second voltage from the reverse voltage of the first voltage.

* * * * *